(12) United States Patent
Chang et al.

(10) Patent No.: US 12,113,093 B2
(45) Date of Patent: Oct. 8, 2024

(54) DISPLAY SUBSTRATES, DISPLAY PANELS AND DISPLAY DEVICES

(71) Applicant: KUNSHAN GO-VISIONOX OPTO-ELECTRONICS CO., LTD., Jiangsu (CN)

(72) Inventors: Miao Chang, Jiangsu (CN); Lu Zhang, Jiangsu (CN); Jinfang Zhang, Jiangsu (CN); Ji Xu, Jiangsu (CN); Chuanzhi Xu, Jiangsu (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 413 days.

(21) Appl. No.: 17/543,796

(22) Filed: Dec. 7, 2021

(65) Prior Publication Data
US 2022/0093682 A1    Mar. 24, 2022

Related U.S. Application Data (63) Continuation of application No. PCT/CN2020/085884, filed on Apr. 21, 2020.

(30) Foreign Application Priority Data

Nov. 21, 2019    (CN) .......................... 201922027980.5

(51) Int. Cl.
H01L 27/15    (2006.01)
H01L 33/54    (2010.01)
H01L 33/62    (2010.01)

(52) U.S. Cl.
CPC ............ *H01L 27/156* (2013.01); *H01L 33/54* (2013.01); *H01L 33/62* (2013.01)

(58) Field of Classification Search
CPC ...... H10K 59/00; H10K 50/86; H10K 50/844; H10K 59/131; H10K 59/121;
(Continued)

(56) References Cited

U.S. PATENT DOCUMENTS 10,868,089 B2 * 12/2020 Oh ....................... H10K 59/131
11,355,047 B2 *  6/2022 Liu ........................ H04N 23/57
(Continued)

FOREIGN PATENT DOCUMENTS

CN    108269840 A    7/2018
CN    108389879 A    8/2018
(Continued)

OTHER PUBLICATIONS

Office Action issued on Sep. 23, 2022, in corresponding Indian Application No. 202217034317, 5 pages.
(Continued)

*Primary Examiner* — Mouloucoulaye Inoussa
(74) *Attorney, Agent, or Firm* — Maier & Maier, PLLC (57) ABSTRACT

Display substrates, display panels, and display devices. A display substrate includes a display area including a first display area, a second display area, and a third display area disposed between the two display areas, sub-pixels disposed in the above three display areas, pixel circuits corresponding to the sub-pixels one to one and signal lines. A light transmittance of first display area is greater than that of second display area, and that of third display area. Pixel circuits corresponding to sub-pixels in first display area are arranged in third display area. Pixel circuits corresponding to sub-pixels arranged along a first direction in display area are connected to a same one of the signal lines. At least one of the signal lines simultaneously connected with pixel
(Continued)

circuits corresponding to sub-pixels in first display area, sub-pixels in second display area, and sub-pixels in third display area.

20 Claims, 4 Drawing Sheets (58) Field of Classification Search
CPC ...... H10K 59/123; H10K 59/65; H10K 59/35; H10K 59/353; H10K 59/126; H10K 59/1213; H10K 59/88; H10K 59/1216; H01L 25/0753; H01L 33/62; H01L 25/167; H01L 33/54; H01L 27/156; H01L 27/124; H01L 27/1214; G09F 9/00; H04N 23/00; G09G 3/3258; G09G 3/2003; G09G 3/2074; G09G 3/3266; G09G 3/3233; G09G 3/32; G09G 3/04; G09G 3/3225; G09G 3/3607; G09G 3/3208; G09G 2310/0251; G09G 2300/0866; G09G 2320/045; G09G 2300/0814; G09G 2310/0262; G09G 2340/0407; G09G 2310/027; G09G 2300/0819; G09G 2300/0443; G09G 2300/0426; G09G 2310/0275; G09G 2320/0233; G09G 2320/0686; G09G 2300/0465; G09G 2300/0404; G09G 2354/00; G09G 2310/0221; G09G 2300/0804; G09G 2310/0281; G09G 2300/0408; G09G 2310/0278; G09G 2300/0452; G09G 2300/0842; G09G 2300/0413; G06F 1/1686; G06F 1/1637; G06F 1/1647; G06F 1/1626; G06F 1/1605; G02F 1/13306; G06T 7/143
See application file for complete search history.

(56) References Cited

U.S. PATENT DOCUMENTS

| | | | | |
|---|---|---|---|---|
| 11,823,601 | B2* | 11/2023 | Peng | G09G 3/20 |
| 11,862,081 | B2* | 1/2024 | Cheng | H10K 50/865 |
| 11,910,645 | B2* | 2/2024 | Zhang | H10K 59/122 |
| 2019/0073961 | A1* | 3/2019 | Park | G02F 1/1362 |
| 2019/0109184 | A1* | 4/2019 | Li | G06F 1/163 |
| 2019/0319212 | A1* | 10/2019 | Park | H10K 59/88 |
| 2020/0052048 | A1* | 2/2020 | Kuo | G06F 1/1605 |
| 2020/0135973 | A1* | 4/2020 | Ma | H01L 31/14 |
| 2020/0176539 | A1* | 6/2020 | Sung | H10K 59/131 |
| 2020/0402452 | A1* | 12/2020 | Hu | G09G 3/3216 |
| 2020/0411610 | A1* | 12/2020 | Zhang | H10K 59/65 |
| 2021/0013272 | A1* | 1/2021 | Zhang | G09G 3/3233 |
| 2021/0013706 | A1* | 1/2021 | Richter | H02G 3/14 |
| 2021/0066409 | A1* | 3/2021 | Fan | H10K 59/131 |
| 2021/0066427 | A1* | 3/2021 | Ma | H01L 27/156 |
| 2021/0090501 | A1* | 3/2021 | Wu | G09G 3/3258 |
| 2021/0098541 | A1* | 4/2021 | Hei | G06T 7/143 |
| 2021/0126066 | A1* | 4/2021 | Hwang | G06F 3/0446 |
| 2021/0141304 | A1* | 5/2021 | Liu | G03F 1/38 |
| 2021/0151517 | A1* | 5/2021 | Zhu | H10K 50/818 |
| 2021/0158750 | A1* | 5/2021 | Xiang | H10K 50/868 |
| 2021/0210510 | A1* | 7/2021 | Hsieh | H04M 1/02 |
| 2021/0248945 | A1* | 8/2021 | Liu | H04N 23/57 |
| 2021/0265430 | A1* | 8/2021 | Chang | H10K 59/353 |
| 2021/0280128 | A1* | 9/2021 | Shen | G09G 3/3225 |
| 2021/0327958 | A1 | 10/2021 | Li et al. | |
| 2021/0327967 | A1* | 10/2021 | Zhang | H10K 59/352 |
| 2021/0351255 | A1* | 11/2021 | Chang | H10K 50/84 |
| 2021/0358379 | A1* | 11/2021 | Li | H10K 59/121 |
| 2021/0359031 | A1* | 11/2021 | Zheng | H04M 1/02 |
| 2021/0359080 | A1* | 11/2021 | Xu | H10K 59/121 |
| 2021/0408111 | A1* | 12/2021 | Lou | H01L 33/62 |
| 2021/0408152 | A1* | 12/2021 | Lou | H10K 59/121 |
| 2022/0028335 | A1* | 1/2022 | Matsueda | G06F 3/0412 |
| 2022/0068211 | A1* | 3/2022 | Jeong | H10K 59/131 |
| 2022/0069047 | A1* | 3/2022 | Yang | H10K 59/1213 |
| 2022/0069048 | A1* | 3/2022 | Bok | G09G 3/3208 |
| 2022/0102421 | A1* | 3/2022 | Yang | H10K 59/353 |
| 2022/0123094 | A1* | 4/2022 | Qiu | G09G 3/3233 |
| 2022/0165804 | A1* | 5/2022 | Lee | H10K 59/121 |
| 2022/0199710 | A1* | 6/2022 | Xu | G06F 1/1637 |
| 2022/0343862 | A1* | 10/2022 | Cheng | H10K 59/00 |

FOREIGN PATENT DOCUMENTS

| | | |
|---|---|---|
| CN | 108461521 A | 8/2018 |
| CN | 208507679 U | 2/2019 |
| CN | 109585519 A | 4/2019 |
| CN | 109950288 A | 6/2019 |
| CN | 109962092 A | 7/2019 |
| CN | 110189639 A | 8/2019 |
| CN | 110189706 A | 8/2019 |
| CN | 209265332 U | 8/2019 |
| CN | 110288945 A | 9/2019 |
| CN | 110289296 A | 9/2019 |
| CN | 110297365 A | 10/2019 |
| CN | 110444125 A | 11/2019 |
| CN | 110444570 A | 11/2019 |

OTHER PUBLICATIONS

Extended European Search Report issued on Dec. 14, 2022, in corresponding European Application No. 20890852.5, 10 pages.
International Search Report (With English Translation) and Written Opinion (With Machine translation) issued on Aug. 12, 2020 in corresponding International Patent Application No. PCT/CN2020/085884; 12 pages.

* cited by examiner

DISPLAY SUBSTRATES, DISPLAY PANELS AND DISPLAY DEVICES

CROSS-REFERENCE TO RELATED APPLICATIONS

This application is a continuation application of International Application No. PCT/CN2020/085884 filed on Apr. 21, 2020, which claims priority to Chinese application No. 201922027980.5, filed on Nov. 21, 2019, the entire contents of which are incorporated herein by reference.

TECHNICAL FIELD

The present application relates to the field of display technologies, and in particular, to a display substrate, a display panel and a display device.

BACKGROUND

With the rapid development of electronic devices, users have increasingly requirements for a screen-to-body ratio, so that a full-screen display of an electronic device has attracted more and more attention in the industry. Traditional electronic devices such as mobile phones and tablet computers need to integrate a front-facing camera, an earpiece, an infrared sensing element, etc., which, therefore, can be arranged in a notched area by notching on a display screen. However, the notched area cannot be used to display images. The screen is a notch screen, or there is a hole on the screen, and external light can enter a photosensitive element located below the screen through the hole on the screen. However, these electronic devices do not have full screens in a true sense, and cannot display in all areas of the entire screen. For example, images cannot be displayed in a camera area.

SUMMARY

According to a first aspect of embodiments of the present application, a display substrate is provided. The display substrate includes a display area including a first display area, a second display area, and a third display area disposed between the first display area and the second display area. A light transmittance of the first display area is greater than a light transmittance of the second display area, and the light transmittance of the first display area is greater than a light transmittance of the third display area.

A plurality of sub-pixels are disposed in the first display area, the second display area, and the third display area. The display substrate is provided with a plurality of pixel circuits corresponding to the plurality of sub-pixels one to one. The pixel circuits corresponding to the sub-pixels in the first display area are arranged in the third display area. The pixel circuits corresponding to the sub-pixels in the second display area are arranged in the second display area. The pixel circuits corresponding to the sub-pixels in the third display area are arranged in the third display area.

The display substrate is further provided with a plurality of signal lines. The pixel circuits corresponding to the sub-pixels arranged along a first direction in the display area are connected to a same one of the signal lines. At least one of the signal lines simultaneously connected with the pixel circuits corresponding to the sub-pixels in the first display area, the pixel circuits corresponding to the sub-pixels in the second display area, and the pixel circuits corresponding to the sub-pixels in the third display area.

According to a second aspect of embodiments of the present application, a display panel is provided. The display panel includes the above-described display substrate and an encapsulation structure.

The encapsulation structure includes a polarizer. The polarizer covers a second display area and a third display area, and does not cover a first display area; or the polarizer covers the first display area, the second display area and the third display area.

According to a third aspect of embodiments of the present application, a display device is provided, where the display device includes:

a housing with a component area;
the above-described display panel covered on the housing,
where the component area is located under the first display area, and one or more electronic elements are arranged in the component area.

In the display substrate, the display panel, and the display device provided by the embodiments of the present application, since the light transmittance of the first display area is greater than the light transmittance of the second display area, and the light transmittance of the first display area is greater than the light transmittance of the third display area, earpieces and photosensitive components can be arranged under the first display area, and a full-screen display of the display substrate can be realized while ensuring normal operations of the photosensitive components. Since the pixel circuits corresponding to the sub-pixels in the first display area are arranged in the third display area, the light transmittance of the first display area can be increased, a structural complexity of the first display area can be reduced, and further an intensity of a diffraction effect generated when external light passes through the first display area can be weakened. Since at least one of the signal lines simultaneously connected with the pixel circuits corresponding to the sub-pixels in the first display area, the pixel circuits corresponding to the sub-pixels in the second display area, and the pixel circuits corresponding to the sub-pixels in the third display area, the pixel circuits corresponding to the sub-pixels in the first display area, the second display area, and the third display area are driven by a same one of the signal lines, which can reduce a complexity of wiring in the display areas of the display substrate while making display effects of the first display area, the second display area, and the third display area more consistent, and is favorable to improve user experience.

DETAILED DESCRIPTION

The technical solutions in embodiments of the present application will be described below clearly and completely in conjunction with the drawings. Obviously, the described embodiments are only a part but not all of the embodiments of the application. Based on the embodiments in this application, all other embodiments obtained by those of ordinary skill in the art without creative work shall fall within the protection scope of the application.

A notched area is arranged on a display screen of an electronic device. Earpieces, cameras, infrared sensing elements and other photosensitive components are arranged in the notched area. External light enters the photosensitive components through the notched area. However, since the notched area cannot display, a full-screen display of the electronic device cannot be realized.

By providing a transparent display area on a part of the screen of the electronic device, the photosensitive components are provided under the transparent display area, which can realize the full-screen display of the electronic device while ensuring normal operations of the photosensitive components. A method for driving a non-transparent display area of the electronic device is an active driving method, and a method for driving the transparent display area is a passive driving method. Two driving methods are adopted on a screen body, which greatly increases a complexity of driving a full screen.

In order to solve the above-mentioned problems, embodiments of the present application provide a display substrate, a display panel, and a display device, which can solve the problems well.

The display substrate, the display panel, and the display device in the embodiments of the present application will be described in detail below with reference to the drawings. In a case of no conflict, the following embodiments and features in implementations can be supplemented or combined with each other.

Figure 1:
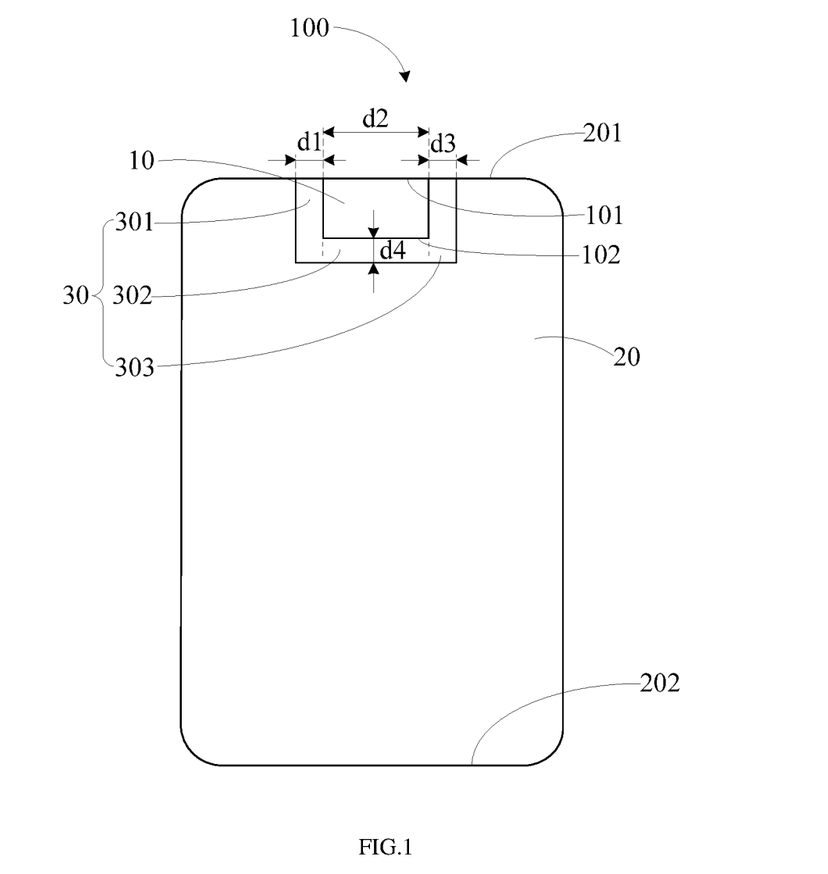
FIG. 1 is a top view illustrating a display substrate provided by embodiments of the present application.
Figure 2:
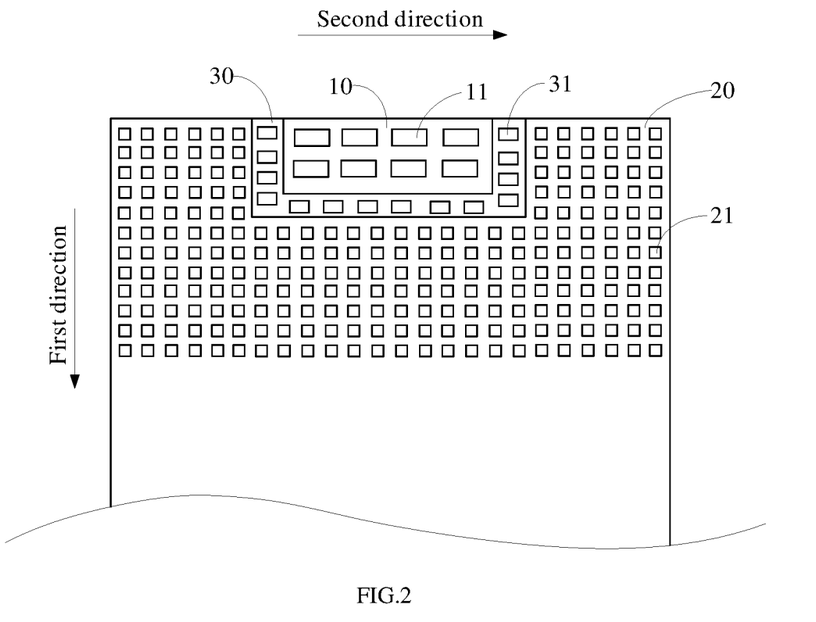
FIG. 2 is a partial schematic diagram illustrating an arrangement of sub-pixels in a display area of a display substrate provided by embodiments of the present application.
Figure 3:
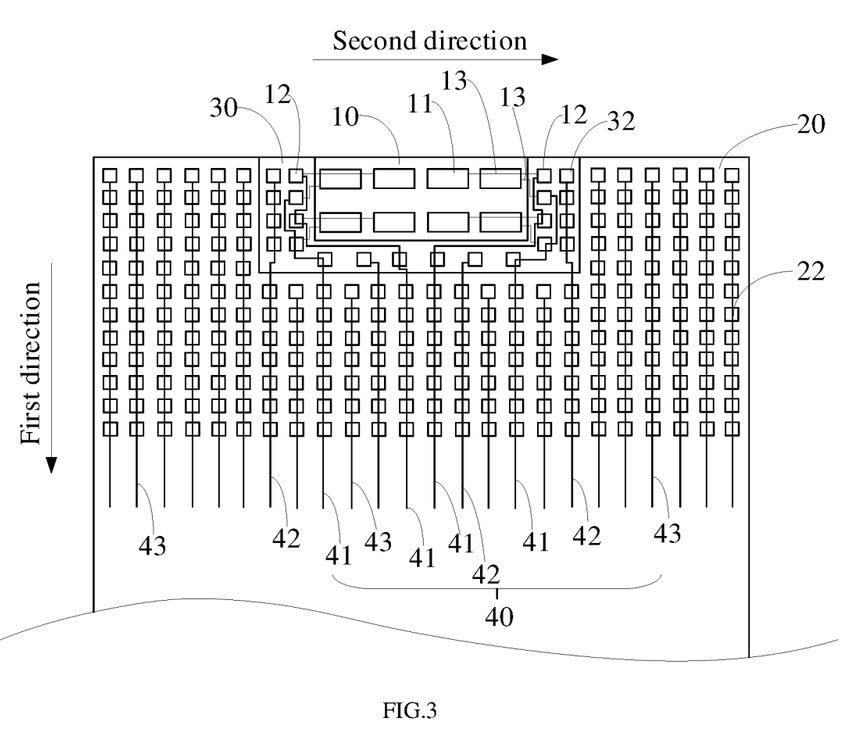
FIG. 3 is a partial schematic diagram illustrating arrangements of pixel circuits and data lines in a display substrate provided by embodiments of the present application.
Figure 4:
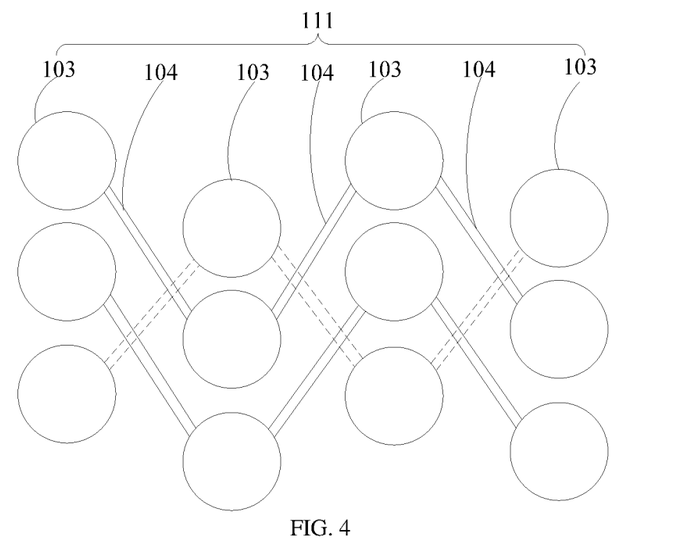
FIG. 4 is a schematic diagram illustrating a projection of first electrodes on a substrate in a first display area of a display substrate provided by embodiments of the present application.
Figure 5:
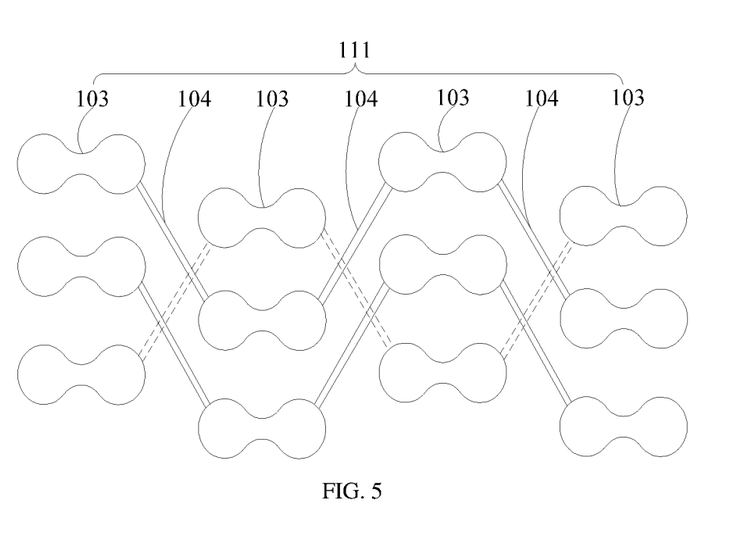
FIG. 5 is a schematic diagram illustrating another projection of first electrodes on a substrate in a first display area of a display substrate provided by embodiments of the present application.
Figure 6:
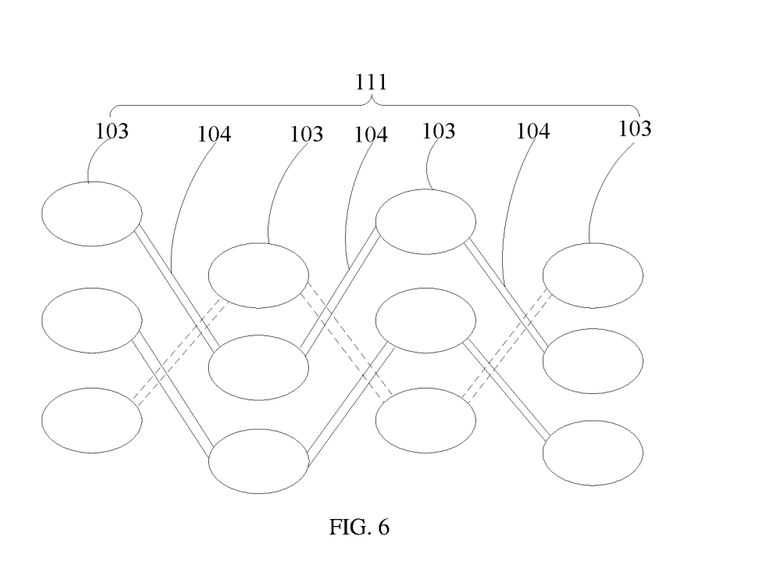
FIG. 6 is a schematic diagram illustrating still another projection of first electrodes on a substrate in a first display area of a display substrate provided by embodiments of the present application.
Figure 7:
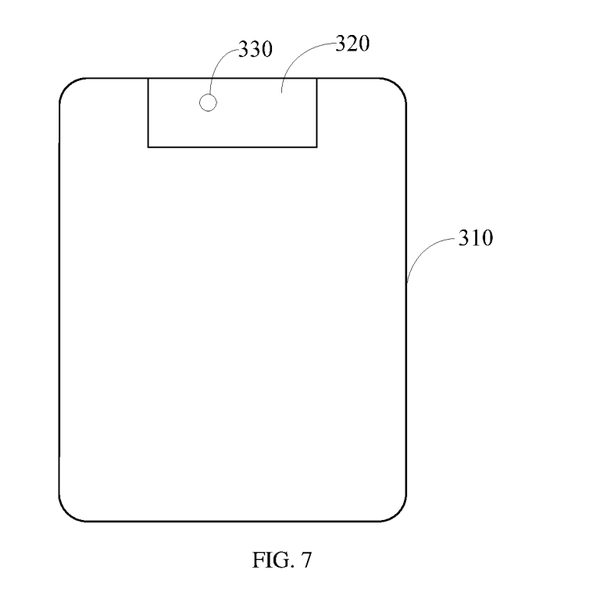
FIG. 7 is a top view illustrating a housing of a display device provided by embodiments of the present application.

FIG. 1 is a top view illustrating a display substrate provided by embodiments of the present application. FIG. 2 is a partial schematic diagram illustrating an arrangement of sub-pixels in a display area of a display substrate provided by embodiments of the present application. FIG. 3 is a partial schematic diagram illustrating arrangements of pixel circuits and data lines in a display substrate provided by embodiments of the present application. FIG. 4 is a schematic diagram illustrating a projection of first electrodes on a substrate in a first display area of a display substrate provided by embodiments of the present application. FIG. 5 is a schematic diagram illustrating another projection of first electrodes on a substrate in a first display area of a display substrate provided by embodiments of the present application. FIG. 6 is a schematic diagram illustrating still another projection of first electrodes on a substrate in a first display area of a display substrate provided by embodiments of the present application. FIG. 7 is a top view illustrating a housing of a display device provided by embodiments of the present application.

The embodiments of the present application provide a display substrate. Referring to FIG. 1, a display substrate 100 includes a first display area 10, a second display area 20, and a third display area 30, and the third display area 30 is disposed between the first display area 10 and the second display area 20. A light transmittance of the first display area 10 is greater than a light transmittance of the second display area 20, and the light transmittance of the first display area 10 is greater than a light transmittance of the third display area 30.

Referring to FIG. 2, a plurality of sub-pixels 11, 21, 31 are disposed in the first display area 10, the second display area 20, and the third display area 30. Referring to FIG. 3, the display substrate 100 is provided with a plurality of pixel circuits 12, 22, 32 corresponding to the plurality of sub-pixels 11, 21, 31 one to one. In some embodiments, the plurality of sub-pixels 11 are disposed in the first display area 10, and the plurality of sub-pixels 11 correspond to the plurality of pixel circuits 12 one to one. The plurality of sub-pixels 21 are disposed in the second display area 20, and the plurality of sub-pixels 21 correspond to the plurality of pixel circuits 22 one to one. The plurality of sub-pixels 31 are disposed in the third display area 30, and the plurality of sub-pixels 31 correspond to the plurality of pixel circuits 32 one to one. The pixel circuits 12 corresponding to the sub-pixels 11 in the first display area 10 are arranged in the third display area 30. The pixel circuits 22 corresponding to the sub-pixels 21 in the second display area 20 are arranged in the second display area 20. The pixel circuits 32 corresponding to the sub-pixels 31 in the third display area 30 are arranged in the third display area 30.

As shown in FIG. 3, the display substrate 100 further includes a plurality of signal lines 40, and the pixel circuits corresponding to the sub-pixels arranged along a first direction in the display area are connected to a same one of the signal lines 40. At least one of the signal lines 40 simultaneously connected with the pixel circuits 12 corresponding to the sub-pixels 11 in the first display area 10, the pixel circuits 22 corresponding to the sub-pixels 21 in the second display area 20, and the pixel circuits 32 corresponding to the sub-pixels 31 in the third display area 30.

In the display substrate 100 provided by the embodiments of the present application, since the light transmittance of the first display area 10 is greater than the light transmittance of the second display area 20, and the light transmittance of the first display area 10 is greater than the light transmittance of the third display area 30, one or more photosensitive components can be arranged under the first display area 10, and a full-screen display of the display substrate 100 can be realized while ensuring normal operations of the photosensitive components. Since the pixel circuits 12 corresponding to the sub-pixels 11 in the first display area 10 are arranged in the third display area 30, the light transmittance of the first display area 10 can be increased, a structural complexity of the first display area 10 can be reduced, and further an intensity of a diffraction effect generated when external light passes through the first display area 10 can be weakened. Since at least one of the signal lines 40 simultaneously connected with the pixel circuits 12 corresponding to the sub-pixels 11 in the first display area 10, the pixel circuits 22 corresponding to the sub-pixels 21 in the second display area 20, and the pixel circuits 32 corresponding to the sub-pixels 31 in the third display area 30, the pixel circuits corresponding to the sub-pixels in the first display area 10, the second display area 20, and the third display area 30 are driven by the same one of the signal lines, which can reduce a complexity of wirings in the display areas of the display substrate 100 while making display effects of the first display area 10, the second display area 20, and the third display area 30 more consistent, and is favorable to improve user experience.

In the embodiments of the present application, referring to FIG. 3, the sub-pixels 11 in the first display area 10 are electrically connected to corresponding pixel circuits 12 via wirings 13. In some embodiments, each of the sub-pixels 11 includes a first electrode, a light-emitting structure located on the first electrode, and a second electrode located on the light-emitting structure. The first electrode of the sub-pixel is electrically connected to corresponding pixel circuit via a wiring 13. The first electrode can be an anode, and the second electrode can be a cathode. The first electrodes of the plurality of sub-pixels 11 can be connected into one piece to form a surface electrode.

In the embodiments of the present application, the pixel circuits corresponding to the plurality of sub-pixels arranged along the first direction are connected to the same one of the signal lines 40. The plurality of sub-pixels arranged along the first direction can refer to being substantially arranged along the first direction. Central axis in the first direction of the plurality of sub-pixels arranged along the first direction can be overlapped or separated by a certain distance.

In the embodiments of the present application, signal lines 40 connected to the pixel circuits 12 corresponding to the sub-pixels 11 in the first display area 10 are connected to the pixel circuits 22 corresponding to the sub-pixels 12 in the second display area 20 and the pixel circuits 32 corresponding to the sub-pixels 31 in the third display area 30. In this way, a wiring complexity of the signal lines 40 can be reduced to the greatest extent.

In some embodiments, a shape of the first display area 10 is a rectangle and an overall shape of the first display area 10 and the third display area 30 is a rectangle. With this arrangement, boundaries of the first display area 10 and the third display area 30 are linear, which can prevent the boundaries of the first display area 10 or the third display area 30 from being non-linear boundaries such as arc-shaped boundaries, resulting in a problem of a single color bright bar appearing at a boundary due to pixel units adjacent to the boundary lacking pixels with a certain color, and thus helps to improve user experience.

In some embodiments, as shown in FIG. 1, the first display area 10 includes a first side 101 and a second side 102 opposite to the first side 101. The first side 101 is parallel to the second side 102, and the first side 101 and the second side 102 are perpendicular to the first direction. The second display area 20 includes a third side 201 and a fourth side 202 opposite to the third side 201. The third side 201 is parallel to the fourth side 202, and the third side 201 and the fourth side 202 are perpendicular to the first direction. The first side 101 and the third side 201 are located in a same line. With this arrangement, when connecting pixel circuits corresponding to sub-pixels located in the first display area 10, the signal lines 40 do not need to bypass (i.e., avoid) the first display area 10, which can simplify the wiring complexity of the signal lines 40.

In some embodiments, the third display area 30 includes a first area 301, a second area 302, and a third area 303 that are sequentially connected. The first area 301 and the third area 303 are located on two sides of the first display area 10. The second area 302 is adjacent to the second side 102. The first area 301, the second area 302, and the third area 303 are all provided with sub-pixels 31 and pixel circuits 32 for driving the sub-pixels 31. The pixel circuits 12 corresponding to the sub-pixels 11 in the first display area 10 are arranged in the first area 301 and the third area 303. In some embodiments, the first area 301 is provided with sub-pixels 31, pixel circuits 32 for driving the sub-pixels 31 in the first area 301, and the pixel circuits 12 for driving the sub-pixels 11. The second area 302 is provided with sub-pixels 31, and pixel circuits 32 for driving the sub-pixels 31 in the second area 302. The third area 303 is provided with sub-pixels 31, pixel circuits 32 for driving the sub-pixels 31 in the third area 303, and the pixel circuits 12 for driving the sub-pixels 11.

The pixel circuits 12 corresponding to the sub-pixels 11 in the first display area 10 are arranged in the first area 301 and the third area 303, which helps to reduce a complexity of the wirings 13 between the sub-pixels 11 and corresponding pixel circuits 12. Moreover, the pixel circuits corresponding to the sub-pixels 11, sub-pixels 21, and sub-pixels 31 arranged in the first direction are connected to the same one of the signal lines 40, and thus the signal lines, when passing through the third display area 30, need to pass the second area 302 and extend to the first area 301 or the third area 303. Extension direction of signal lines 40 are changed in the second area 302, which is favorable to simplify the complexity of wiring in the first area 301 and the third area 303, so that the first area 301 and the third area 303 can have more space for arranging the pixel circuits 12 corresponding to the sub-pixels 11.

In some embodiments, pixel circuits 12 corresponding to sub-pixels 11 in the first display area 10 and adjacent to the first area 301 are arranged in the first area 301, and pixel circuits 12 corresponding to sub-pixels 11 in the first display area 10 and adjacent to the third area 303 are arranged in the third area 303. A distance between the sub-pixels in the first display area 10 and adjacent to the first area 301 and the first area 301 is less than a distance between the sub-pixels in the first display area 10 and adjacent to the first area 301 and the third area 303. A distance between the sub-pixels in the first display area 10 and adjacent to the third area 303 and the third area 303 is less than a distance between the sub-pixels in the first display area 10 and adjacent to the third area 303 and the first area 301. With this arrangement, lengths of wirings 13 between the sub-pixels 11 and corresponding pixel circuits 12 can be shorter, which helps to simplify the complexity of wiring.

In some embodiments, a ratio of a size of the first area 301 in a second direction to a size of the first display area 10 in the second direction is in a range of ⅕ to ½. The second direction is perpendicular to the first direction. Referring again to FIG. 1, if the size of the first area 301 in the second direction is d1, and the size of the first display area 10 in the second direction is d2, a ratio of d1 to d2 is in a range of greater than or equal to ⅕ and less than or equal to ½. With this arrangement, a space of the first area 301 is suitable for placing the pixel circuits corresponding to the sub-pixels in the first display area 10 and adjacent to the first area 301, and the first area 301 is avoided from being larger.

In some embodiments, a ratio of a size of the third area 303 in the second direction to the size of the first display area 10 in the second direction is in a range of ⅕ to ½. If the size of the third area 303 in the second direction is d3, and the size of the first display area 10 in the second direction is d2, a ratio of d3 to d2 is in a range of greater than or equal to ⅕ and less than or equal to ½. With this arrangement, a space of the third area 303 is suitable for placing the pixel circuits, where the pixel circuits correspond to the sub-pixels in the first display area 10 adjacent to the third area 303, and the third area 303 is avoided from being larger.

In some embodiments, a ratio of a size of the second area 302 in the first direction to the size of the first display area 10 in the second direction is in a range of 1/20 to 1/5. If the size of the second area 302 in the first direction is d4, and the size of the first display area 10 in the second direction is d2, a ratio of d4 to d2 is in a range of greater than or equal to 1/20 and less than or equal to 1/5. With this arrangement, a space of the second area 302 is used for the signal lines 40 to change directions, and the second area 302 is avoided from being larger.

In some embodiments, the first direction can be a column direction, and the second direction can be a row direction, or the first direction can be the row direction, and the second direction can be the column direction. In the drawings, only the first direction being the column direction and the second direction being the row direction are taken as an example for illustration. Other cases will not be illustrated again.

In some embodiments, the light transmittance of the third display area 30 is greater than the light transmittance of the second display area 20. With this arrangement, a display brightness of the display substrate 100 can gradually transition from the second display area 20 to the first display area 10, which avoids a significant difference between the first display area 10 and the second display area 20, and can improve user experience.

In some embodiments, a density of the sub-pixels 31 in the third display area 30 is less than a density of the sub-pixels 21 in the second display area 20, and a density of the sub-pixels 11 in the first display area 10 is less than the density of the sub-pixels 21 in the second display area 20. The density of the sub-pixels 11 in the first display area 10 can be equal or unequal to the density of the sub-pixels 31 in the third display area 30.

With this arrangement, a number of the pixel circuits 32 corresponding to the sub-pixels 31 in the third display area 30 is small, so that there can be extra space in the third display area 30 for arranging the pixel circuits 12 corresponding to the sub-pixels 11 in the first display area 10.

In some embodiments, the signal lines 40 include a plurality of data lines. The data lines provide a data voltage for pixel circuits. The data lines include a plurality of first data lines 41, a plurality of second data lines 42, and a plurality of third data lines 43. The first data lines 41 are connected to the pixel circuits 12 corresponding to the sub-pixels 11 in the first display area 10, the pixel circuits 22 corresponding to the sub-pixels 21 in the second display area 20 and the pixel circuits 32 corresponding to the sub-pixels 31 in the third display area 30. the second data lines 42 are connected to the pixel circuits 22 corresponding to the sub-pixels 21 in the second display area 20, and the pixel circuits 32 corresponding to the sub-pixels 31 in the third display area 30. the third data lines 43 are connected to the pixel circuits 22 corresponding to the sub-pixels 21 in the second display area 20. The arrangement of the three types of data lines enables pixel circuits corresponding to a plurality of sub-pixels arranged along the first direction to be connected to a same data line, which helps to simplify the wiring complexity of the data lines and the control over the sub-pixels.

In some embodiments, the signal lines 40 can be scan lines or the like.

In some embodiments, the display substrate 100 includes a substrate and the sub-pixels 11, 21, and 31 are located on the substrate.

In some embodiments, the first electrode of the sub-pixel 11 in the first display area 10 includes at least one electrode block. Referring to FIGS. 4 to 6, two or more electrode blocks 103 in a first electrode 111 are arranged along the second direction, two adjacent electrode blocks 103 are electrically connected. The first electrode 111 can further include connecting portions 104, and two adjacent electrode blocks 103 are electrically connected through corresponding connecting portion 104. The light-emitting structure includes light-emitting structure blocks located on the electrode blocks 103.

A projection of the electrode blocks 103 on the substrate includes at least one first graphic unit. A shape of the first graphic unit includes a circle, an ellipse, a dumbbell, a gourd or a rectangle. Referring to FIG. 4, the first electrode 111 includes four electrode blocks 103. A projection of an electrode block 103 on the substrate includes one first graphic unit, and a shape of the first graphic unit is a circle. Referring to FIG. 5, the first electrode 111 includes four electrode blocks 103. A projection of an electrode block 103 on the substrate includes one first graphic unit, and a shape of the first graphic unit is a dumbbell. Referring to FIG. 6, the first electrode 111 includes four electrode blocks 103. A projection of an electrode block 103 on the substrate includes one first graphic unit, and a shape of the first graphic unit is an ellipse. When the shape of the first graphic unit is a circle, an ellipse, a dumbbell, or a gourd, a periodic structure generated by diffraction can be changed by these shapes, that is, distribution of a diffraction field is changed, thereby the diffraction effect generated when external incident light passes through the first display area 10 is weakened. Moreover, when the shape of the first graphic unit is a circle, an ellipse, a dumbbell, or a gourd, a distance between first electrodes of adjacent sub-pixels changes continuously or intermittently, so that the first electrodes of adjacent sub-pixels produce diffraction at different positions, and diffraction effects at different positions are counteracted each other, which helps to weaken the diffraction effects, and thus images taken by a camera arranged under the first display area can be ensured to have a high definition.

In some embodiments, a projection of the light-emitting structure blocks on the substrate includes at least one second graphic unit, and a shape of the second graphic unit includes a circle, an ellipse, a dumbbell, a gourd or a rectangle. When the shape of the second graphic units is a circle, an ellipse, a dumbbell, or a gourd, a periodic structure generated by diffraction can be changed by these shapes, that is, the distribution of a diffraction field is changed, thereby the diffraction effect generated when external incident light passes through the first display area 10 is weakened. Moreover, when the shape of the second graphic units is a circle, an ellipse, a dumbbell, or a gourd, a distance between light-emitting structures of adjacent sub-pixels changes continuously or intermittently, so that the light-emitting structures of adjacent sub-pixels produce diffraction at different positions, and diffraction effects at different positions are counteracted each other, which can efficiently weaken the diffraction effects, and thus the images taken by the camera arranged under the first display area can be ensured to have the high definition.

In some embodiments, the at least one first graphic unit corresponding to the projection of the electrode blocks on the substrate can be same as or different from the at least one second graphic unit corresponding to the projection of the light-emitting structure blocks located on the electrode blocks on the substrate. When the first graphic unit is different from the second graphic unit, the projection of the electrode blocks on the substrate is different from the projection of the light-emitting structure blocks on the substrate, which can further weaken the diffraction effect generated when light passes through the first display area 10.

In some embodiments, materials of the connecting portions 104 and the electrode blocks 103 can include indium tin oxide, or indium zinc oxide, or silver-doped indium tin oxide, or silver-doped indium zinc oxide. In this way, light transmittances of the connecting portions 104 and the electrode blocks 103 can be higher. When the materials of the connecting portions 104 and the electrode blocks 103 are the silver-doped indium tin oxide or the silver-doped indium zinc oxide, resistances of the connecting portions and the electrode blocks can be reduced while ensuring high light transmittance of the first display area.

In some embodiments, the second electrode can be a thin film with a certain transparency, and materials of the second electrode can be magnesium silver, or silver, or aluminum, or molybdenum, or titanium, or titanium nitride, or nickel, or aluminum zinc oxide or aluminum titanium oxide. Magnesium silver is a mixed material containing magnesium and silver.

An embodiment of the present application further provides a display panel. The display panel includes any of the display substrates as described above and an encapsulation structure. The encapsulation structure is located on a side of the display substrate 100 away from a substrate.

The encapsulation structure includes a polarizer. The polarizer covers the second display area 20 and the third display area 30, and does not cover the first display area 10; or the polarizer covers the first display area 10, the second display area 20, and the third display area 30. The polarizer can dissipate reflected light on a surface of the display panel and be used for improving user experience. When the polarizer is not arranged in the first display area 10, the light transmittance of the first display area 10 can be increased.

In some embodiments, the encapsulation structure can further include an encapsulation layer, a glass cover plate, a touch layer, and the like. The encapsulation layer can be a thin film encapsulation layer or a glass powder encapsulation layer.

An embodiment of the present application further provides a display device. The display device includes a housing, and the display panel as described above. Referring to FIG. 7, a housing 310 has a component area 320, and the display panel covers the housing 310. The component area 320 is located under the first display area 10, and one or more electronic elements 330 are arranged in the component area 320.

The electronic elements can include earpieces, optical components, distance sensors, etc., where the optical components include at least one of a front camera, an infrared sensor, an infrared lens, a flood light sensing element, an ambient light sensor, or a dot projector.

The component area of the housing can be a notched area, and the first display area of the display panel can be fitted to corresponding notched area, so that the optical components can emit or collect light through the first display area 10.

The display device can be a digital device such as a mobile phone, a tablet computer, or a palmtop computer.

It should be pointed out that in the drawings, sizes of layers and areas may be exaggerated for clarity of illustration. It will be understood that when an element or layer is referred to as being "above" another element or layer, the element or layer can be directly on the another element or there may be an intermediate layer. In addition, it will be understood that when an element or layer is referred to as being "under" another element or layer, the element or layer can be directly under the another element or there may be more than one intermediate layer or element. In addition, it will be understood that when a layer or element is referred to as being "between" two layers or elements, the layer or element can be the only layer between the two layers or elements or there may be more than one intermediate layer or element. Similar reference signs indicate similar elements throughout the disclosure.

The invention claimed is:

1. A display substrate, comprising:
a display area comprising:
 a first display area;
 a second display area, a light transmittance of the first display area being greater than a light transmittance of the second display area; and
 a third display area disposed between the first display area and the second display area, the light transmittance of the first display area being greater than a light transmittance of the third display area;
a plurality of sub-pixels, disposed in the first display area, the second display area, and the third display area;
a plurality of pixel circuits corresponding to the plurality of sub-pixels one to one, the pixel circuits corresponding to the sub-pixels disposed in the first display area being arranged in the third display area, the pixel circuits corresponding to the sub-pixels being disposed in the second display area arranged in the second display area, and the pixel circuits corresponding to the sub-pixels in the third display area being arranged in the third display area; and
a plurality of signal lines, wherein the pixel circuits corresponding to the sub-pixels arranged along a first direction in the display area are connected to a same signal line; at least one of the plurality of signal lines simultaneously connected with the pixel circuits corresponding to the sub-pixels in the first display area, the pixel circuits corresponding to the sub-pixels in the second display area, and the pixel circuits corresponding to the sub-pixels in the third display area.

2. The display substrate according to claim 1, wherein a shape of the first display area is a rectangle and an overall shape of the first display area and the third display area is a rectangle.

3. The display substrate according to claim 2, wherein
the first display area comprises a first side and a second side opposite to the first side, the first side is parallel to the second side, and the first side and the second side are both perpendicular to the first direction;
the second display area comprises a third side and a fourth side opposite to the third side, the third side is parallel to the fourth side, and the third side and the fourth side are both perpendicular to the first direction; and
the first side and the third side are located in a same line.

4. The display substrate according to claim 3, wherein the third display area comprises a first area, a second area, and a third area that are sequentially connected, the first area and the third area are located at two sides of the first display area, and the second area is adjacent to the second side;
the first area, the second area, and the third area are all provided with the sub-pixels and the pixel circuits for driving the sub-pixels, and the pixel circuits corresponding to the sub-pixels in the first display area are arranged in the first area and the third area.

5. The display substrate according to claim 4, wherein the pixel circuits corresponding to the sub-pixels in the first display area and adjacent to the first area are arranged in the first area, and the pixel circuits corresponding to the sub-pixels in the first display area and adjacent to the third area are arranged in the third area.

6. The display substrate according to claim 4, wherein a ratio of a size of the first area in a second direction to a size of the first display area in the second direction is in a range of ⅕ to ½;
- a ratio of a size of the second area in the first direction to the size of the first display area in the second direction is in a range of ½₀ to ⅕; and
- a ratio of a size of the third area in the second direction to the size of the first display area in the second direction is in a range of ⅕ to ½;
- wherein the first direction is perpendicular to the second direction.

7. The display substrate according to claim 4, wherein the signal lines connecting the pixel circuits corresponding to the sub-pixels in the first display area, the pixel circuits corresponding to the sub-pixels in the second display area, and the pixel circuits corresponding to the sub-pixels in the third display area are respectively bent in the second area.

8. The display substrate according to claim 1, wherein the signal lines comprise a plurality of data lines;
- the data lines comprise a plurality of first data lines, a plurality of second data lines and a plurality of third data lines;
- the first data lines are connected to the pixel circuits corresponding to the sub-pixels in the first display area, the pixel circuits corresponding to the sub-pixels in the second display area and the pixel circuits corresponding to the sub-pixels in the third display area;
- the second data lines are connected to the pixel circuits corresponding to the sub-pixels in the second display area and the pixel circuits corresponding to the sub-pixels in the third display area; and
- the third data lines are connected to the pixel circuits corresponding to the sub-pixels in the second display area.

9. The display substrate according to claim 1, wherein the light transmittance of the third display area is greater than the light transmittance of the second display area.

10. The display substrate according to claim 1, wherein a density of the sub-pixels in the third display area is less than a density of the sub-pixels in the second display area, and a density of the sub-pixels in the first display area is less than the density of the sub-pixels in the second display area.

11. The display substrate according to claim 10, wherein the density of the sub-pixels in the third display area is equal to the density of the sub-pixels in the first display area.

12. The display substrate according to claim 1, wherein the display substrate comprises a substrate and the plurality of sub-pixels are located on the substrate;
- each sub-pixel in the first display area comprises a first electrode, a light-emitting structure located on the first electrode, and a second electrode located on the light-emitting structure, wherein the first electrode comprises at least one electrode block;
- in a case that the first electrode comprises a plurality of electrode blocks, two adjacent electrode blocks are electrically connected, and the light-emitting structure comprises a plurality of light-emitting structure blocks located on the plurality of electrode blocks;
- a projection of the electrode blocks on the substrate comprises at least one first graphic unit, and a shape of a first graphic unit comprises a circle, an ellipse, a dumbbell, a gourd or a rectangle.

13. The display substrate according to claim 12, wherein a projection of the light-emitting structure blocks on the substrate comprises at least one second graphic unit, and a shape of a second graphic unit comprises a circle, an ellipse, a dumbbell, a gourd or a rectangle.

14. A display device, comprising:
- a housing with a component area;
- a display panel including:
  - the display substrate according to claim 1, and
  - an encapsulation structure,
    - wherein the encapsulation structure comprises a polarizer, the polarizer covers the second display area and the third display area and exposing the first display area; or
    - the polarizer covers the first display area, the second display area and the third display area
- wherein the component area is located under the first display area, and one or more electronic elements are arranged in the component area.

15. A display panel having a display substrate, the display substrate comprising:
- a display area comprising:
  - a first display area;
  - a second display area, a light transmittance of the first display area being greater than a light transmittance of the second display area;
  - a third display area disposed between the first display area and the second display area, the light transmittance of the first display area being greater than a light transmittance of the third display area;
- a plurality of sub-pixels, disposed in the first display area, the second display area, and the third display area;
- a plurality of pixel circuits corresponding to the plurality of sub-pixels one to one, the pixel circuits corresponding to the sub-pixels being disposed in the second display area arranged in the second display area, and the pixel circuits corresponding to the sub-pixels in the third display area being arranged in the third display area; and
- a plurality of signal lines comprising a plurality of data lines, the data lines comprising a plurality of first data lines, a plurality of second data lines and a plurality of third data lines;
- wherein the pixel circuits corresponding to the sub-pixels arranged along a first direction in the display area are connected to a same signal line; at least one of the plurality of signal lines simultaneously connected with the pixel circuits corresponding to the sub-pixels in the first display area, the pixel circuits corresponding to the sub-pixels in the second display area, and the pixel circuits corresponding to the sub-pixels in the third display area;
- the first data lines are connected to the pixel circuits corresponding to the sub-pixels in the first display area, the pixel circuits corresponding to the sub-pixels in the second display area and the pixel circuits corresponding to the sub-pixels in the third display area;
- the second data lines are connected to the pixel circuits corresponding to the sub-pixels in the second display area and the pixel circuits corresponding to the sub-pixels in the third display area.

16. The display panel according to claim 15, wherein the light transmittance of the third display area is greater than the light transmittance of the second display area.

17. The display panel according to claim 15, wherein a density of the sub-pixels in the third display area is less than a density of the sub-pixels in the second display area, and a density of the sub-pixels in the first display area is less than the density of the sub-pixels in the second display area.

18. The display panel according to claim 16, wherein a density of the sub-pixels in the third display area is equal to a density of the sub-pixels in the first display area.

19. The display panel according to claim 15, wherein the display substrate comprises a substrate and the plurality of sub-pixels are located on the substrate;
- each sub-pixel in the first display area comprises a first electrode, a light-emitting structure located on the first electrode, and a second electrode located on the light-emitting structure, wherein the first electrode comprises at least one electrode block;
- in a case that the first electrode comprises a plurality of electrode blocks, two adjacent electrode blocks are electrically connected, and the light-emitting structure comprises a plurality of light-emitting structure blocks located on the plurality of electrode blocks;
- a projection of the electrode blocks on the substrate comprises at least one first graphic unit, and a shape of a first graphic unit comprises a circle, an ellipse, a dumbbell, a gourd or a rectangle.

20. The display panel according to claim 19, wherein a projection of the light-emitting structure blocks on the substrate comprises at least one second graphic unit, and a shape of a second graphic unit comprises a circle, an ellipse, a dumbbell, a gourd or a rectangle.

* * * * *